United States Patent [19]
Huang et al.

[11] Patent Number: 5,830,375
[45] Date of Patent: Nov. 3, 1998

[54] AUTOMATED METHOD FOR MONITORING AND CONTROLLING THE ORTHOPHOSPHORIC ACID ETCH RATE OF SILICON NITRIDE INSULATOR LAYERS

[75] Inventors: Cheng-Chung Huang, Hsin-Chu; Shu Mei Chen, ChangHua, both of Taiwan

[73] Assignee: Taiwan Semiconductor Manufacturing Company Ltd., Hsin-Chu, Taiwan

[21] Appl. No.: 661,258

[22] Filed: Jun. 10, 1996

[51] Int. Cl.$^6$ .................................................. H01L 21/306
[52] U.S. Cl. ................................................................ 216/84
[58] Field of Search .................................................. 216/84

[56] References Cited

U.S. PATENT DOCUMENTS

| 4,092,211 | 5/1978 | Morris | 156/644 |
| 5,200,024 | 4/1993 | Blonder et al. | 156/628 |
| 5,332,145 | 7/1994 | Bell et al. | 228/105 |

*Primary Examiner*—Yogendra N. Gupta
*Attorney, Agent, or Firm*—George O. Saile; Stephen B. Ackerman; Alek P. Szecsy

[57] ABSTRACT

A method for continuously monitoring and controlling the etch rates within integrated circuits of silicon nitride insulator layers and silicon nitride insulator structures in aqueous ortho-phosphoric acid (H3PO4) solutions. To practice the method of the present invention, there is first provided an etch bath chamber containing therein an aqueous ortho-phosphoric acid (H3PO4) solution. There is provided continuously from the etch bath chamber to a hydrometer cell a sample stream of the aqueous ortho-phosphoric acid (H3PO4) solution. The sample stream of the aqueous ortho-phosphoric acid (H3PO4) solution is analyzed continuously within the hydrometer cell to provide a continuous specific gravity analysis of the sample stream of the aqueous ortho-phosphoric acid (H3PO4) solution. Finally, the continuous specific gravity analysis of the sample stream of the aqueous ortho-phosphoric acid (H3PO4) solution is employed to add intermittently to the aqueous ortho-phosphoric acid (H3PO4) solution a quantity of water sufficient to maintain a first water content of the aqueous ortho-phosphoric acid (H3PO4) solution within the etch bath chamber at a value greater than about 5 weight percent. Optionally, the continuous specific gravity analysis of the sample stream of the aqueous ortho-phosphoric acid (H3PO4) solution may also be simultaneously employed to add intermittently to the aqueous ortho-phosphoric acid (H3PO4) solution a quantity of heat sufficient to maintain a second water content of the aqueous ortho-phosphoric acid (H3PO4) solution within the etch bath at a value less than about 20 weight percent. The present invention also discloses the hydrometer cell and an automated etch bath chamber which are employed in practicing the method of the present invention.

10 Claims, 3 Drawing Sheets

AUTOMATED METHOD FOR MONITORING AND CONTROLLING THE ORTHOPHOSPHORIC ACID ETCH RATE OF SILICON NITRIDE INSULATOR LAYERS

BACKGROUND OF THE INVENTION

1. Field of the Invention

The present invention relates generally to silicon nitride insulator layers and silicon nitride insulator structures within integrated circuits. More particularly, the present invention relates to automated methods for monitoring and controlling the aqueous ortho-phosphoric acid (H3PO4) solution etch rate of silicon nitride insulator layers and silicon nitride insulator structures within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

In addition to forming insulator layers within integrated circuits from the common insulator material silicon oxide, insulator layers within integrated circuits may also be formed from other insulator materials which provide novel and/or desirable insulator layer properties, such as, but not limited to, insulator layer dielectric properties and insulator layer etch resistance properties. A common other insulator material often employed in forming such insulator layers within integrated circuits is silicon nitride. Insulator layers formed from silicon nitride within integrated circuits are often employed in forming etch stop insulator layers beneath and/or above silicon oxide insulator layers within integrated circuits, as well as in forming capacitor insulator layers within capacitors formed within integrated circuits.

When employing silicon nitride insulator layers within integrated circuits, it is common in the art that those silicon nitride insulator layers will be patterned or stripped through a wet chemical etch method employing an aqueous ortho-phosphoric acid (H3PO4) solution at an elevated temperature, typically an elevated refluxing temperature at about 165 degrees centigrade. The chemical reaction by which silicon nitride is etched in an aqueous ortho-phosphoric acid (H3PO4) solution at elevated temperature is illustrated by equation (1).

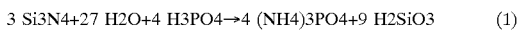

As seen by equation (1), when etching silicon nitride with an aqueous ortho-phosphoric acid (H3PO4) solution there is consumed in addition to a moderate stoichiometric excess of ortho-phosphoric acid (H3PO4) in comparison with silicon nitride a substantial stoichiometric excess of water in comparison with both silicon nitride and ortho-phosphoric acid (H3PO4).

As water is consumed during the etching of a silicon nitride insulator layer or a silicon nitride insulator structure in an aqueous ortho-phosphoric acid (H3PO4) solution, a secondary series of reactions occurs wherein the ortho-phosphoric acid (H3PO4) within the aqueous ortho-phosphoric acid (H3PO4) solution is dehydrated through an intermediate pyro-phosphoric acid (H4P2O7) and an intermediate meta-phosphoric acid (HPO3) to yield phosphorus pentoxide, as illustrated by the series of dehydration reactions shown by equation (2) to equation (4).

Through the series of dehydration reactions shown by equation (2) to equation (4), the concentration of ortho-phosphoric acid (H3PO4) within the dehydrated aqueous ortho-phosphoric acid (H3PO4) solution may typically be sufficiently lowered such that the etch rate of a silicon nitride insulator layer or silicon nitride insulator structure in contact with the dehydrated aqueous ortho-phosphoric acid (H3PO4) solution is also significantly decreased, often with an accompanying compromise of etch selectivity of the silicon nitride insulator layer or the silicon nitride insulator structure with respect to other layers adjoining the silicon nitride insulator layer or silicon nitride insulator structure, such as, but not limited to, silicon oxide insulator layers and silicon substrate layers.

An additional unfortunate consequence of the series of dehydration reactions shown by equation (2) to equation (4) is that phosphorus pentoxide is a solid material with limited solubility within dehydrated aqueous ortho-phosphoric acid (H3PO4) solutions at temperatures at which those dehydrated aqueous ortho-phosphoric acid (H3PO4) solutions may be employed in etching silicon nitride insulator layers or silicon nitride insulator structures. At sufficiently high concentration, the solid phosphorus pentoxide often precipitates from dehydrated aqueous ortho-phosphoric acid (H3PO4) solutions, thus yielding a particulate contaminant residue upon the surfaces of semiconductor substrates from whose surfaces it is desired to etch silicon nitride insulator layers or silicon nitride insulator structures through contact with those dehydrated ortho-phosphoric acid (H3PO4) solutions.

Although it is possible to re-hydrate through manual additions of water dehydrated aqueous ortho-phosphoric acid (H3PO4) solutions employed in etching silicon nitride insulator layers and silicon nitride insulator structures within integrated circuits, such manual additions of water will: (1) if sporadically made yield re-hydrated aqueous ortho-phosphoric acid (H3PO4) solutions with undesirably variable etch rates for silicon nitride insulator layers and silicon nitride insulator structures, and (2) if excessively made yield re-hydrated aqueous ortho-phosphoric acid (H3PO4) solutions with undesirably low etch rates for silicon nitride insulator layers and silicon nitride insulator structures.

From the foregoing, it is therefore desirable within the art of etching silicon nitride insulator layers and silicon nitride insulator structures within integrated circuits with aqueous ortho-phosphoric acid (H3PO4) solutions to provide a method by which the ortho-phosphoric acid (H3PO4) concentration within the aqueous ortho-phosphoric acid (H3PO4) solution may be constantly monitored and controlled. It is towards that goal that the present invention is directed.

Methods through which solutions of materials employed in manufacturing integrated circuits and microelectronics products may controlled to uniformly and reproducibly perform a manufacturing function within those integrated circuits and microelectronic products are known in the arts of integrated circuit manufacture and microelectronics products manufacture. For example, Morris, in U.S. Pat. No. 4,092,211 discloses a method for controlling within a boiling aqueous ortho-phosphoric acid (H3PO4) solution the etch rate of a silicon oxide insulator layer which is employed in masking a silicon nitride insulator layer. The method employs the deliberate addition of a silicate material to the boiling aqueous ortho-phosphoric acid (H3PO4) solution. In addition, Bell et al., in U.S. Pat. No. 5,332,145 disclose a method for continuously monitoring and controlling the compositions of low-solids soldering fluxes that employ a solvent with a specific gravity closely matched to the specific gravity of the flux composition. The method employs an ultra-violet absorption detector to monitor and control the solvent content within the flux composition.

Desirable in the art are analogous methods through which the etch rates of silicon nitride insulator layers and silicon nitride insulator structures in aqueous ortho-phosphoric acid (H3PO4) solutions may be monitored and controlled. Particularly desirable are analogous methods through which the etch rates of silicon nitride insulator layers and silicon nitride insulator structures within aqueous ortho-phosphoric acid (H3PO4) solutions may be continuously monitored and controlled.

SUMMARY OF THE INVENTION

A first object of the present invention is to provide a method for monitoring and controlling the etch rates within integrated circuits of silicon nitride insulator layers and silicon nitride insulator structures in aqueous ortho-phosphoric acid (H3PO4) solutions.

A second object of the present invention is to provide a method for continuously monitoring and controlling the etch rates within integrated circuits of silicon nitride insulator layers and silicon nitride insulator structures in aqueous ortho-phosphoric acid (H3PO4) solutions.

A third object of the present invention is to provide a method in accord with the first object of the present invention or the second object of the present invention, which method is readily manufacturable.

In accord with the objects of the present invention, there is provided a method for continuously monitoring and controlling the etch rates within integrated circuits of silicon oxide insulator layers and silicon nitride insulator structures in aqueous ortho-phosphoric acid (H3PO4) solutions. To practice the method of the present invention, there is first provided an etch bath containing therein an aqueous ortho-phosphoric acid (H3PO4) solution. There is provided continuously from the etch bath to a hydrometer cell a sample stream of the aqueous ortho-phosphoric acid (H3PO4) solution. The sample stream of the aqueous ortho-phosphoric acid (H3PO4) solution is analyzed continuously within the hydrometer cell to provide a continuous specific gravity analysis of the sample stream of the aqueous ortho-phosphoric acid (H3PO4) solution. Finally, the continuous specific gravity analysis of the sample stream of the aqueous ortho-phosphoric acid (H3PO4) solution is employed to add intermittently to the aqueous ortho-phosphoric acid (H3PO4) solution a quantity of water sufficient to maintain a first water content of the aqueous ortho-phosphoric acid (H3PO4) solution within the etch bath at a value greater than about 5 weight percent.

Additionally, the continuous specific gravity analysis of the sample stream of the aqueous ortho-phosphoric acid (H3PO4) solution may also be simultaneously employed to add intermittently to the aqueous ortho-phosphoric acid (H3PO4) solution a quantity of heat sufficient to maintain a second water content of the aqueous ortho-phosphoric acid (H3PO4) solution within the etch bath at a value less than about 20 weight percent. The present invention also discloses the hydrometer cell and an automated etch bath chamber which are employed in practicing the method of the present invention.

The present invention provides a method for continuously monitoring and controlling the etch rates within integrated circuits of silicon nitride insulator layers and silicon nitride insulator structures in aqueous ortho-phosphoric acid (H3PO4) solutions. By continuously providing a specific gravity analysis of an aqueous ortho-phosphoric acid (H3PO4) solution, and employing the specific gravity analysis in adding intermittently to the aqueous ortho-phosphoric acid (H3PO4) solution a quantity of water sufficient to maintain a first water content of the aqueous ortho phosphoric acid (H3PO4) solution at a value greater than about 5 weight percent, the etch rates of silicon nitride insulator layers and silicon nitride insulator structures within the aqueous ortho-phosphoric acid (H3PO4) solution may simultaneously be monitored and controlled. Through a chemical equilibrium, the etch rates of silicon nitride insulator layers and silicon nitride insulator structures in aqueous ortho-phosphoric acid (H3PO4) solutions depend upon both the water content and the ortho-phosphoric acid (H3PO4) content of those aqueous ortho-phosphoric acid (H3PO4) solutions. Through a secondary series of dehydration reactions, the water content of an aqueous ortho-phosphoric acid (H3PO4) is also related to the ortho-phosphoric acid (H3PO4) content of the aqueous ortho-phosphoric acid (H3PO4) solution.

The method of the present invention is readily manufacturable. The use of hydrometers in obtaining discrete and continuous measurements of specific gravities is generally known in the art of measuring specific gravities of solvents and solutions, including but not limited to solvents and solutions employed in integrated circuit manufacture. Employing the results of a continuous specific gravity analysis of an aqueous ortho-phosphoric acid (H3PO4) solution to maintain a first water content and/or a second water content of the aqueous ortho-phosphoric acid (H3PO4) solution within certain limits thus presents no barriers to manufacturability.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
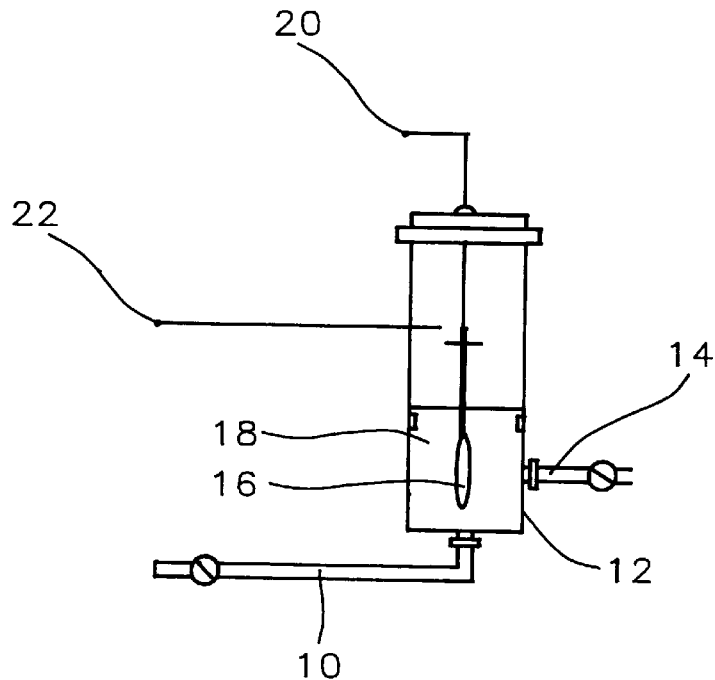
FIG. 1 shows a schematic cross-sectional diagram of a first hydrometer cell employed in monitoring and controlling the etch rates of silicon nitride insulator layers and silicon nitride insulator structures in aqueous ortho-phosphoric acid (H3PO4) solutions in accord with the first preferred embodiment of the method of the present invention.

The present invention provides a method for continuously monitoring and controlling within integrated circuits the etch rates of silicon nitride insulator layers and silicon nitride insulator structures in aqueous ortho-phosphoric acid (H3PO4) solutions. The method of the present invention continuously monitors the etch rates of silicon nitride insulator layers and silicon nitride insulator structures in aqueous ortho-phosphoric acid (H3PO4) solutions through a continuous specific gravity analysis of the aqueous ortho-phosphoric acid (H3PO4) solutions. The continuous specific gravity analysis is obtained employing a hydrometer cell. The continuous specific gravity analysis of the aqueous ortho-phosphoric acid (H3PO4) solutions provides a measure of the water content and the ortho-phosphoric acid (H3PO4) content of the aqueous ortho-phosphoric acid (H3PO4) solutions. The water content and the ortho-phosphoric acid (H3PO4) content of the aqueous ortho-phosphoric acid (H3PO4) solutions provides a measure of the etch rates of silicon nitride insulator layers and silicon nitride insulator structures in those aqueous ortho-phosphoric acid (H3PO4) solutions.

The method of the present invention continuously controls the etch rates of silicon nitride insulator layers and silicon nitride insulator structures in aqueous ortho-phosphoric acid (H3PO4) solutions through adding intermittently a quantity of water to the aqueous ortho-phosphoric acid (H3PO4) solutions to maintain a first water content of the aqueous ortho-phosphoric acid (H3PO4) solutions at a value greater than about 5 weight percent. The quantity of water added intermittently to the aqueous ortho-phosphoric acid (H3PO4) solutions is controlled through the continuous specific gravity analysis provided by the hydrometer cell. The method of the present invention may also optionally continuously control the etch rates of silicon nitride insulator layers and silicon nitride insulator structures in aqueous ortho-phosphoric acid (H3PO4) solutions through adding intermittently a quantity of heat to the aqueous ortho-phosphoric acid (H3PO4) solutions to maintain a second water content of the aqueous ortho-phosphoric acid (H3PO4) solutions at a value less than about 20 weight percent. The quantity of heat added intermittently to the aqueous ortho-phosphoric acid (H3PO4) solutions is also controlled through the continuous specific gravity analysis provided by the hydrometer cell.

The method of the present invention may be employed in monitoring and controlling the aqueous ortho-phosphoric acid (H3PO4) solution etch rates of silicon nitride insulator layers and silicon nitride insulator structures within various types of integrated circuits. The method of the present invention may be employed in monitoring and controlling the aqueous ortho-phosphoric acid (H3PO4) solution etch rates of silicon nitride insulator layers and silicon nitride insulator structures within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention has broad applicability in monitoring and controlling within integrated circuits the etch rates of silicon nitride insulator layers and silicon nitride insulator structures in aqueous ortho-phosphoric acid (H3PO4) solutions.

Referring now to FIG. 1, there is shown a schematic cross-sectional diagram of a first hydrometer cell which is employed in monitoring and controlling within integrated circuits the etch rates of silicon nitride insulator layers and silicon nitride insulator structures in aqueous ortho-phosphoric acid (H3PO4) solutions in accord with the first preferred embodiment of the method of the present invention. As is shown in FIG. 1, the first hydrometer cell is comprised of an inlet structure 10 and an outlet structure 14, both of which inlet structure 10 and outlet structure 14 access a hydrometer chamber 12. Within the hydrometer chamber 12, a hydrometer float 16 is immersed in an aqueous ortho-phosphoric acid (H3PO4) solution 18 maintained at a constant level and a constant temperature, the constant temperature typically being in the range of from about 23 to about 27 degrees centigrade.

If the specific gravity of the aqueous ortho-phosphoric acid (H3PO4) solution 18 is comparatively high due to evaporation of water from the aqueous ortho-phosphoric acid (H3PO4) solution 18 maintained at elevated temperature or consumption of water when the aqueous ortho-phosphoric acid (H3PO4) solution 18 is employed in etching silicon nitride insulator layers or silicon nitride insulator structures in contact with the aqueous ortho-phosphoric acid (H3PO4) solution 18, the hydrometer float 16 will be raised within the hydrometer chamber 12 and close an electrical circuit between a first electrical contact 20 and a second electrical contact 22. The first electrical contact 20 is connected to a source voltage (not shown). The second electrical contact 22 is connected to a water source controller (not shown) which is actuated by the source voltage. Upon actuation of the water source controller by the source voltage, water is added to the aqueous ortho-phosphoric acid (H3PO4) solution 18. When a sufficient quantity of water has been added to the aqueous ortho-phosphoric acid (H3PO4) solution 18, the level of the hydrometer float 16 within the aqueous ortho-phosphoric acid (H3PO4) solution 18 within the hydrometer chamber 12 will be lowered, thus opening the electrical circuit between the first electrical contact 20 and the second electrical contact 22.

Therefore, through the action of the hydrometer float 16 within the aqueous ortho-phosphoric acid solution 18 contained within the hydrometer chamber 12 of the first hydrometer cell, the specific gravity, the water content and the ortho-phosphoric acid content of the aqueous ortho-phosphoric acid solution 18 may be monitored and controlled. Through monitoring and controlling the water content and/or the ortho-phosphoric acid content of the aqueous ortho-phosphoric acid (H3PO4) solution 18, the etch rates of silicon nitride insulator layers and silicon nitride insulator structures in the aqueous ortho-phosphoric acid (H3PO4) solution 18 are also monitored and controlled.

Figure 2:
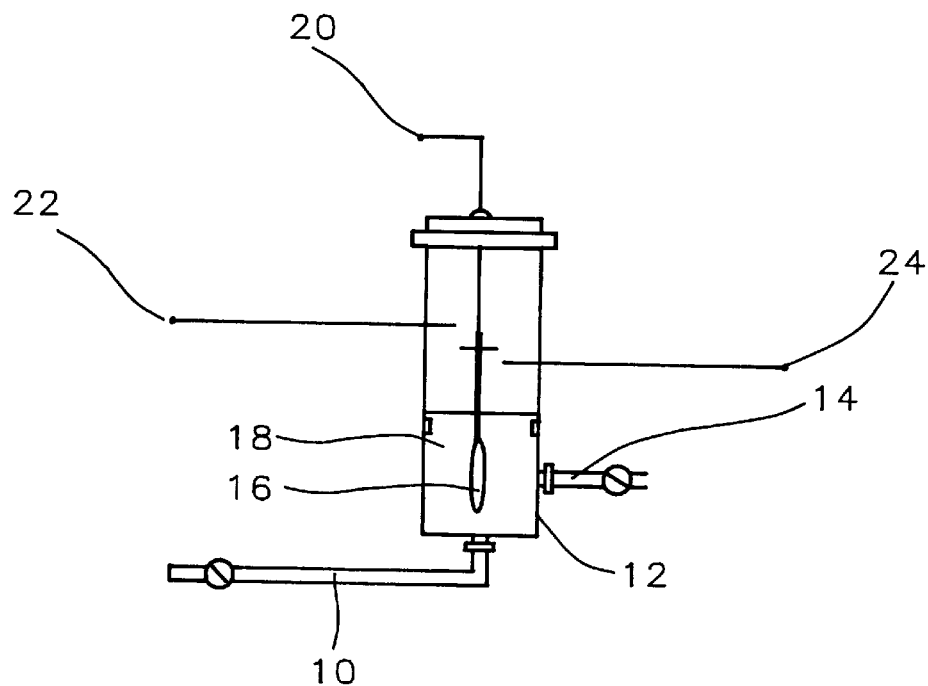
FIG. 2 shows a schematic cross-sectional diagram of a second hydrometer cell employed in monitoring and controlling the etch rates of silicon nitride insulator layers and silicon nitride insulator structures in aqueous ortho-phosphoric acid (H3PO4) solutions in accord with the second preferred embodiment of the method of the present invention.

Referring now to FIG. 2, there is shown a schematic cross-sectional diagram of a second hydrometer cell employed in controlling the etch rates within integrated circuits of silicon nitride insulator layers and silicon nitride insulator structures in aqueous ortho-phosphoric acid (H3PO4) solutions in accord with the second preferred embodiment of the method of the present invention. The second hydrometer cell as illustrated in FIG. 2 is otherwise equivalent to the first hydrometer cell as illustrated in FIG. 1, with the exception of the addition within the second hydrometer cell as illustrated in FIG. 2 of a third electrical contact 24. The third electrical contact 24 is connected to a heat source controller (not shown) which is actuated by the source voltage.

The second hydrometer cell as illustrated in FIG. 2 functions otherwise equivalently to the first hydrometer cell as illustrated in FIG. 1, with the exception of one additional function provided by the second hydrometer cell as illustrated in FIG. 1. If the specific gravity of the aqueous ortho-phosphoric acid (H3PO4) solution 18 contained within the hydrometer chamber 12 of the second hydrometer cell is lowered due to excessive water content, the hydrometer float 16 will be lowered within the aqueous ortho-phosphoric acid (H3PO4) solution 18, thus closing an electrical circuit between the first electrical contact 20 and the third electrical contact 24. Upon closing the electrical circuit between the first electrical contact 20 and the third electrical contact 24, the heat source controller is actuated by the source voltage. The heat source controller then adds intermittently a quantity of heat to the aqueous ortho-phosphoric acid (H3PO4) solution 18 to lower the water content of the aqueous ortho-phosphoric acid (H3PO4) solution 18 to a concentration where the hydrometer float 16 is raised within the aqueous ortho-phosphoric acid (H3PO4) solution 18 within the hydrometer chamber 12, thus opening the electrical circuit between the first electrical contact 20 and the third electrical contact 24.

Thus, through the second hydrometer cell as illustrated in FIG. 2 both a first water content (typically at a lower level) and a second water content (typically at a higher level) may be monitored and controlled within the aqueous ortho-phosphoric acid (H3PO4) solution 18. Within the first hydrometer cell as illustrated in FIG. 1 only a first water content is monitored and controlled within the aqueous ortho-phosphoric acid (H3PO4) solution 18.

Figure 3:
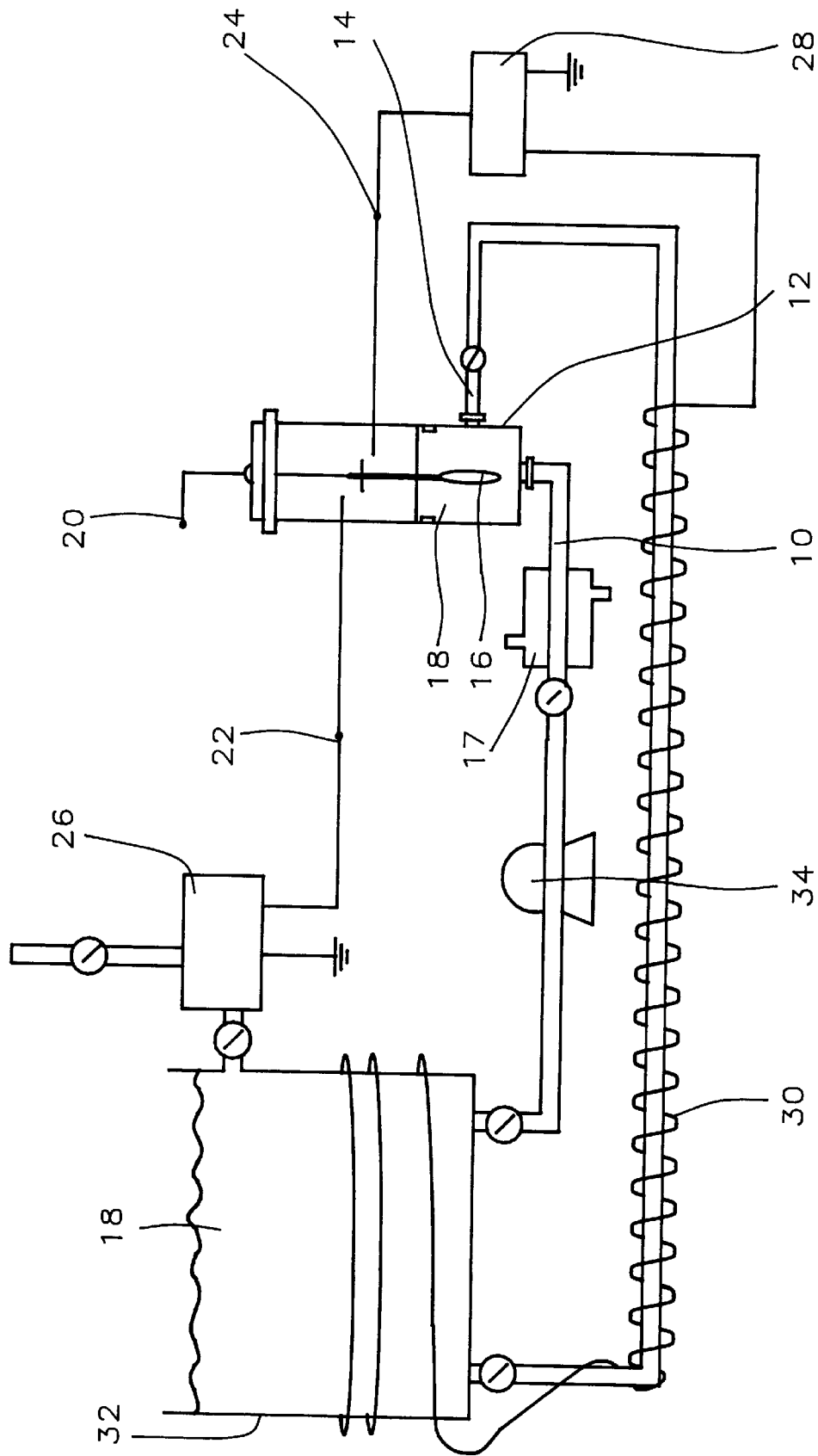
FIG. 3 shows a schematic cross-sectional diagram illustrating the second hydrometer cell in conjunction with an etch bath chamber, thus forming an automated etch bath chamber through which may be monitored and controlled within integrated circuits the etch rates of silicon nitride insulator layers and silicon nitride insulator structures in aqueous ortho-phosphoric acid (H3PO4) solutions in accord with the second preferred embodiment of the method of the present invention.

Referring now to FIG. 3, there is shown a schematic cross-sectional diagram illustrating the manner in which the second hydrometer cell employed within the second preferred embodiment of the method of the present invention may preferably be installed adjoining a conventional aqueous ortho-phosphoric acid (H3PO4) solution etch bath chamber to provide an automated aqueous ortho-phosphoric acid (H3PO4) solution etch bath chamber. Shown in FIG. 3 is an etch bath chamber 32 in which is contained the aqueous ortho-phosphoric acid (H3PO4) solution 18. A sample stream of the aqueous ortho-phosphoric acid (H3PO4) solution 18 from the etch bath chamber 32 is provided through a chiller 17 and into the second hydrometer cell by means of a pump 34 attached to the inlet structure 10 of the hydrometer chamber 12 of the second hydrometer cell. The outlet structure 14 of the hydrometer cell returns the sample stream of the aqueous ortho-phosphoric acid (H3PO4) solution 18 to the etch bath chamber 32, thus providing continuous recirculation of the aqueous ortho-phosphoric acid (H3PO4) solution 18 within the etch bath chamber 32.

When the specific gravity of the aqueous ortho-phosphoric acid (H3PO4) solution 18 is sufficiently high such that the hydrometer float 16 closes the electrical circuit between the first electrical contact 20 and the second electrical contact 22, the water source controller 26 is actuated by the source voltage to add intermittently a quantity of water to the aqueous ortho-phosphoric acid (H3PO4) solution 18 in the etch bath chamber 32 sufficient to lower the specific gravity of the aqueous ortho-phosphoric acid (H3PO4) solution 18 when passing through the hydrometer chamber 12. When the specific gravity of the aqueous ortho-phosphoric acid (H3PO4) solution 18 is sufficiently low such that the hydrometer float 16 closes the electrical circuit between the first electrical contact 20 and the third electrical contact 24, the heat source controller 28 is actuated by the source voltage to add intermittently a quantity of heat to the aqueous ortho-phosphoric acid (H3PO4) solution 18 through a line and bath heater 30 sufficient to raise the specific gravity of the aqueous ortho-phosphoric acid solution when passing through the hydrometer chamber 12.

In order for the first preferred embodiment of the method of the present invention and the second preferred embodiment of the method of the present invention to optimally monitor and control within integrated circuits the etch rates of silicon nitride insulator layers and silicon nitride insulator structures in an aqueous ortho-phosphoric acid (H3PO4) solution, several parameters are preferably defined with respect to the first hydrometer cell, the second hydrometer cell, the etch bath chamber 32 and the aqueous ortho-phosphoric acid (H3PO4) solution 18. To optimally monitor and control the etch rates of silicon nitride insulator layers and silicon nitride insulator structures in the aqueous ortho-phosphoric acid (H3PO4) solution 18, a first specific gravity of the aqueous ortho-phosphoric acid (H3PO4) solution 18 at which the first hydrometer cell or the second hydrometer cell closes the electrical circuit between the first electrical contact 20 and the second electrical contact 22 preferably corresponds to a first water content within the aqueous ortho-phosphoric acid (H3PO4) solution 18 at a value greater than about 5 weight percent. Analogously, the second specific gravity of the aqueous ortho-phosphoric acid (H3PO4) solution 18 at which the second hydrometer cell closes the electrical circuit between the first electrical contact 20 and the third electrical contact 24 preferably corresponds to a second water content within the aqueous ortho-phosphoric acid (H3PO4) solution 18 at a value less than about 20 weight percent.

In addition to designing and calibrating the first hydrometer cell and the second hydrometer cell in accord with the foregoing characteristics with respect to the first water content and the second water content of the aqueous ortho-phosphoric acid (H3PO4) solution 18, it is also preferable for both the first preferred embodiment of the method of the present invention and the second preferred embodiment of the method of the present invention that the components of the hydrometer cell be formed of a size sufficient to allow the sample stream of the aqueous ortho-phosphoric acid (H3PO4) solution 18 to be monitored at a sample flow rate sufficient to assure uniformity of the aqueous ortho-phosphoric acid (H3PO4) solution 18. Preferably, the sample flow rate of the aqueous ortho-phosphoric acid (H3PO4) solution 18 is in the range of from about 0.5 to about 1 liters per minute. To further assure uniformity of the aqueous ortho-phosphoric acid (H3PO4) solution 18, the ratio of the sample flow rate of the sample stream of the aqueous ortho-phosphoric acid (H3PO4) solution 18 through the first hydrometer cell or the second hydrometer cell (in liters per minute) with respect to the volume of the aqueous ortho-phosphoric acid (H3PO4) solution 18 within the etch bath chamber 32 (in liters) is preferably from about 1:20 to about 1:30. Finally, the aqueous ortho-phosphoric acid (H3PO4) solution 18 is preferably maintained at a temperature of from about 160 to about 170 degrees centigrade in the etch bath chamber and preferably maintained at a temperature of from about 23 to about 27 degrees centigrade in the first hydrometer cell or the second hydrometer cell.

Upon immersing an integrated circuit having formed upon its surface a silicon nitride insulator layer or a silicon nitride insulator structure into the aqueous ortho-phosphoric acid ($H3PO4$) solution 18 within the etch bath chamber 32 as illustrated in FIG. 3, the etch rate of the silicon nitride insulator layer or silicon nitride insulator structure is monitored and uniformly controlled through the second preferred embodiment of the method of the present invention.

EXAMPLES

An automated etch bath chamber constructed in accord with the automated etch bath chamber as illustrated in FIG. 3 was employed in monitoring and controlling the ortho-phosphoric acid ($H3PO4$) concentrations and water concentrations within a series of aqueous ortho-phosphoric acid ($H3PO4$) solutions. The ortho-phosphoric acid ($H3PO4$) concentrations and water concentrations were monitored and controlled at a series of water concentrations in the range of 20 weight percent to 5 weight percent corresponding with a series of ortho-phosphoric acid ($H3PO4$) concentrations in the range of 80 to about 95 percent.

A series of silicon nitride insulator layers formed upon a series of semiconductor substrates was then etched in the series of aqueous ortho-phosphoric acid ($H3PO4$) solutions at a constant temperature in the range of 163 to 167 degrees centigrade for a constant time period. Each of the silicon nitride insulator layers was formed upon a semiconductor substrate within the series of semiconductor substrates at a thickness of 1500 angstroms through a Plasma Enhanced Chemical Vapor Deposition (PECVD) method employing silane and nitrogen as source materials. After etching in the series of aqueous ortho-phosphoric acid ($H3PO4$) solutions, the thicknesses of the series of silicon nitride insulator layers upon series of semiconductor substrates was remeasured. From the thicknesses of the silicon nitride insulator layers prior to and subsequent to etching in the aqueous ortho-phosphoric acid ($H3PO4$) solutions there was then calculated a series of etch rates as a function of ortho-phosphoric acid ($H3PO4$) concentration. The series of etch rates was then plotted as a function of ortho-phosphoric acid ($H3PO4$) concentration, as illustrated in FIG. 4.

Figure 4:
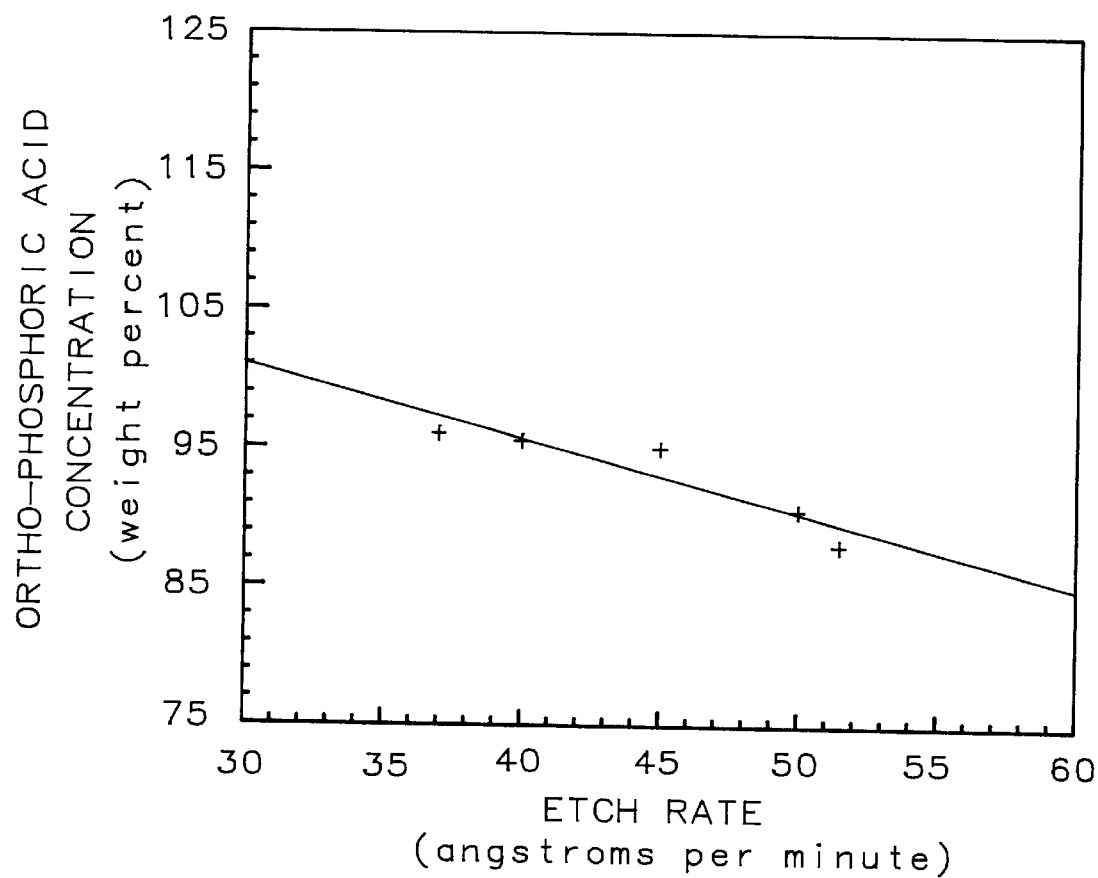
FIG. 4 shows a plot of Ortho-Phosphoric Acid Concentration versus Etch Rate for etching in a series of aqueous ortho-phosphoric acid (H3PO4) solutions a series of silicon nitride insulator layers formed upon a series of semiconductor substrates, the etching being monitored and controlled with an automated etch bath chamber in accord with the automated etch bath chamber illustrated in FIG. 3.

From review of the data illustrated in FIG. 4 is seen that an automated etch bath chamber in accord with FIG. 3 assists in providing a method for monitoring and control of etch rates of silicon nitride insulator layers with aqueous ortho-phosphoric acid ($H3PO4$) solutions.

As is understood by a person skilled in the art, the first hydrometer cell as illustrated in FIG. 1, the second hydrometer cell as illustrated in FIG. 2 and the automated etch bath chamber as illustrated in FIG. 3 are illustrative of a hydrometer cell and automated etch bath chamber which may be employed in practicing the method of the present invention, rather than limiting of the hydrometer cell and automated etch bath chamber which may be employed in practicing the method of the present invention. Revisions may be made to the hydrometer cell and automated etch bath chamber through which is practiced the preferred embodiments of the method of the present invention while still employing a hydrometer cell and an automated etch bath chamber which yields a method which is within the spirit and scope of the present invention, as defined by the accompanying Claims.

What is claimed is:

1. A method for continuously monitoring and controlling the etch rates of silicon nitride insulator layers and silicon nitride insulator structures in aqueous ortho-phosphoric acid ($H3PO4$) solutions comprising:

providing an etch bath chamber containing therein an aqueous ortho-phosphoric acid ($H3PO4$) solution;

providing continuously from the etch bath chamber to a hydrometer cell a sample stream of the aqueous ortho-phosphoric acid ($H3PO4$) solution;

analyzing continuously within the hydrometer cell the sample stream of the aqueous ortho-phosphoric acid ($H3PO4$) solution to provide a continuous specific gravity analysis of the sample stream of the aqueous ortho-phosphoric acid ($H3PO4$) solution; and employing the continuous specific gravity analysis of the sample stream of the aqueous ortho-phosphoric acid ($H3PO4$) solution to add intermittently to the aqueous ortho-phosphoric acid ($H3PO4$) solution a quantity of water sufficient to maintain a first water content of the aqueous ortho-phosphoric acid ($H3PO4$) solution within the etch bath chamber at a value greater than about 5 weight percent.

2. The method of claim 1 wherein the sample stream of the aqueous ortho-phosphoric acid ($H3PO4$) solution is continuously provided from the etch bath chamber to the hydrometer cell through continuously recirculating the aqueous ortho-phosphoric acid ($H3PO4$) solution contained within the etch bath chamber.

3. The method of claim 1 wherein the sample stream of the aqueous ortho-phosphoric acid ($H3PO4$) solution is continuously provided from the etch bath chamber to the hydrometer cell at a sample flow rate of from about 0.5 to about 1 liters per minute.

4. The method of claim 1 wherein the ratio of the sample flow rate of the aqueous ortho-phosphoric acid ($H3PO4$) solution through the hydrometer cell (in liters per minute) to the volume of the aqueous ortho-phosphoric acid ($H3PO4$) solution contained within the etch bath chamber (in liters) is from about 1:20 to about 1:30.

5. The method of claim 1 wherein the temperature of the aqueous ortho-phosphoric acid ($H3PO4$) solution within the etch bath chamber is maintained at a temperature in the range of from about 160 to about 170 degrees centigrade.

6. A method for continuously monitoring and controlling the etch rates of silicon nitride insulator layers and silicon nitride insulator structures in aqueous ortho-phosphoric acid ($H3PO4$) solutions comprising:

providing an etch bath chamber containing therein an aqueous ortho-phosphoric acid ($H3PO4$) solution;

providing continuously from the etch bath chamber to a hydrometer cell a sample stream of the aqueous ortho-phosphoric acid ($H3PO4$) solution;

analyzing continuously within the hydrometer cell the sample stream of the aqueous ortho-phosphoric acid ($H3PO4$) solution to provide a continuous specific gravity analysis of the sample stream of the aqueous ortho-phosphoric acid ($H3PO4$) solution;

employing the continuous specific gravity analysis of the sample stream of the aqueous ortho-phosphoric acid ($H3PO4$) solution to add intermittently to the aqueous ortho-phosphoric acid ($H3PO4$) solution a quantity of water sufficient to maintain a first water content of the aqueous ortho-phosphoric acid ($H3PO4$) solution at a value greater than about 5 weight percent; and employing simultaneously the continuous specific gravity analysis of the sample stream of the aqueous ortho-phosphoric acid ($H3PO4$) solution to add intermittently to the aqueous ortho-phosphoric acid solution a quantity of heat sufficient to maintain a second water content of the aqueous ortho-phosphoric acid ($H3PO4$) solution within the etch bath chamber at a value less than about 20 weight percent.

7. The method of claim 6 wherein the sample stream of the aqueous ortho-phosphoric acid (H3PO4) solution is provided through continuously recirculating the aqueous ortho-phosphoric acid (H3PO4) solution contained within the etch bath chamber.

8. The method of claim 6 wherein the sample stream of the aqueous ortho-phosphoric acid (H3PO4) solution is continuously provided from the etch bath chamber to the hydrometer cell at a sample flow rate of from about 0.5 to about 1 liters per minute.

9. The method of claim 6 wherein the ratio of the sample flow rate (in liters per minute) of the aqueous ortho-phosphoric acid (H3PO4) solution through the hydrometer cell to the volume of aqueous ortho-phosphoric acid (H3PO4) solution (in liters) contained within the etch bath chamber is from about 1:20 to about 1:30.

10. The method of claim 6 wherein the temperature of the aqueous ortho-phosphoric acid (H3PO4) acid solution within the etch bath chamber is maintained in the range of from about 160 to about 170 degrees centigrade.

* * * * *